US006407659B2

(12) United States Patent
Mochida et al.

(10) Patent No.: US 6,407,659 B2
(45) Date of Patent: Jun. 18, 2002

(54) ELECTRONIC DEVICE

(75) Inventors: Norihiro Mochida, Shiga-ken; Toshikazu Nakamura, Yokaichi, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/858,684

(22) Filed: May 16, 2001

(30) Foreign Application Priority Data

May 18, 2000 (JP) ....................................... 2000-146127

(51) Int. Cl.[7] ................................................. H01L 7/10

(52) U.S. Cl. ..................... 338/22 R; 338/234; 338/236; 338/221

(58) Field of Search ........................... 338/22 R, 225 D, 338/232, 234, 236, 221

(56) References Cited

U.S. PATENT DOCUMENTS 4,894,637 A * 1/1990 Yamada et al. ........... 338/22 R
4,924,204 A * 5/1990 Uchida ..................... 338/22 R
5,117,089 A * 5/1992 Honkomp et al. .......... 219/201
5,142,265 A * 8/1992 Motoyoshi et al. ....... 338/22 R
5,606,473 A * 2/1997 Forbord et al. .......... 360/97.01
5,760,336 A * 6/1998 Wang ........................ 174/52.1
5,963,125 A * 10/1999 Mochida et al. ............ 338/234
6,025,771 A * 2/2000 Kobayashi et al. ....... 338/22 R
6,160,473 A * 12/2000 Gruhn ...................... 338/22 R
6,172,593 B1 * 1/2001 Mochida et al. .......... 338/22 R

FOREIGN PATENT DOCUMENTS

JP 9-306704 11/1997

* cited by examiner

*Primary Examiner*—Karl D. Easthom
(74) *Attorney, Agent, or Firm*—Keating & Bennett, LLP

(57) ABSTRACT

A positive thermistor element is supported by being clamped by first and second resilient contact members that are opposed to each other so as to be disposed along a diagonal and first and second positioning protrusions that are opposed to each other so as to be disposed along the other diagonal of the positive thermistor element. The first resilient contact member is located toward the periphery of the positive thermistor element from the second positioning protrusion and the second resilient contact member is positioned toward an inner portion of the positive thermistor element from the first positioning protrusion.

20 Claims, 3 Drawing Sheets

ELECTRONIC DEVICE

BACKGROUND OF THE INVENTION

1. Field of the Invention

The present invention relates to electronic devices including electronic device elements having electrodes provided on opposite major surfaces of the respective electronic device elements. In particular, the present invention relates to an electronic device including an electronic device element supported by being resiliently clamped by resilient contact members that are arranged to individually contact the electrodes.

2. Description of the Related Art

An electronic device related to the present invention is a positive thermistor device. The positive thermistor device is used for limiting electrical current in, for example, a motor driving circuit of a refrigerator, a demagnetizing circuit for a picture tube of a television or a monitor display, and other various uses.

The positive thermistor device includes a positive thermistor element including electrodes provided on respective opposite major surfaces of the positive thermistor element. A resilient contact member resiliently contacts each electrode, whereby the resilient contact member presses the positive thermistor element, thereby supporting the positive thermistor element.

In the positive thermistor device, the positive thermistor element deteriorates according to the condition and environment in which it is used. As a result, the positive thermistor element is abnormally heated, and is sometimes broken.

Electrical current sometimes continues to be applied to the positive thermistor element via the resilient contact members even when the positive thermistor element has been broken, whereby a more serious accident may occur in which a case containing the positive thermistor element is softened, and other defects may occur.

In order to overcome these problems, a structure is disclosed in, for example, Japanese Unexamined Patent Application Publication No. 9-306704, in which when the positive thermistor element is broken, fragments of the positive thermistor element are moved by a spring action of the resilient contact members, thereby opening a circuit and preventing the situation from becoming more serious.

FIGS. 4A and 4B show the structure of the positive thermistor device disclosed in the above Japanese Unexamined Patent Application Publication No. 9-306704.

A positive thermistor element 1 shown in FIG. 4A is has an overall disc-configured configuration. The positive thermistor element 1 is provided with first and second electrodes (not shown) disposed on first and second major surfaces 2 and 3 of the positive thermistor element 1 and oppose each other in the thickness direction thereof.

First and second terminal units 4 and 5 are arranged to clamp the positive thermistor element 1. The first terminal unit 4 includes a first resilient contact member 6, and the second terminal unit 5 includes a second resilient contact member 7.

First and second positioning protrusions 8 and 9 are arranged to clamp the positive thermistor element 1.

The first resilient contact member 6 and the first positioning protrusion 8 contact the first major surface 2 at positions that are separate from each other on the first major surface 2 of the positive thermistor element 1. The second resilient contact member 7 and the second positioning protrusions 9 contact the second major surface 3 at positions that are separate from each other on the second major surface 3. The first resilient contact member 6 resiliently contacts the first electrode on the first major surface 2 so as to be electrically connected to the first electrode. The second resilient contact member 7 resiliently contacts the second electrode on the second major surface 3 so as to be electrically connected to the second electrode.

The first resilient contact member 6 opposes the second positioning protrusion 9 with the positive thermistor element 1 therebetween, the first resilient contact member 6 being positioned toward the periphery of the positive thermistor element 1 from the second positioning protrusion 9. The second resilient contact member 7 opposes the first positioning protrusion 8 with the positive thermistor element 1 therebetween, the second resilient contact member 7 being positioned toward the periphery of the positive thermistor element 1 from the first positioning protrusion 8.

With this arrangement, when the positive thermistor element 1 is broken at a fracture point 10, as schematically shown in FIG. 4A, a fragment 11 moves so as to rotate in a direction along an arrow 13 about a point, at which the fragment 11 is in contact with the second positioning protrusion 9, as a fulcrum and a fragment 12 moves so as to rotate in a direction along an arrow 14 about a point, at which the fragment 12 is in contact with the first positioning protrusion 8, as a fulcrum, as shown in FIG. 4B, since resilient pressing forces of the first and second resilient contact members 6 and 7 are applied to the fragments 11 and 12, respectively, which have been produced by the fracture.

The fragments 11 and 12 move in the directions along the arrows 13 and 14, respectively, thereby interrupting electrical current applied via the positive thermistor element 1 and opening a circuit.

The directions along the arrows 13 and 14 of the movement of the fragments 11 and 12, respectively, shown in FIG. 4B are opposite to each other with respect to the fracture 10. That is, the fragments 11 and 12 move so as to prevent each other from moving in the directions along the arrows 13 and 14, respectively.

Therefore, there is a problem in that even when an accident occurs such that the positive thermistor element 1 is broken, the fragments 11 and 12 sometimes do not sufficiently separate from each other, whereby the circuit does not become open and the electrical current continues to be applied through the broken positive thermistor element 1.

The above-described problems occur not only in the positive thermistor device. The problems may occur in any electronic device in which an electronic component element corresponding to the positive thermistor element is supported, is supplied with electrical current, and is broken due to deterioration in the same manner as the above-described positive thermistor device.

SUMMARY OF THE INVENTION

Preferred embodiments of the present invention provide an electronic device in which the above-described problems are overcome.

According to a preferred embodiment of the present invention, an electronic device includes an electronic device element including first and second major surfaces opposing each other in the thickness direction, and first and second electrodes disposed on the first and second major surfaces, respectively, a conductive first resilient contact member and a first positioning protrusion which is not electrically connected to the first resilient contact member, the first resilient contact member and the first positioning protrusion being in contact with the first major surface at respective positions thereof separated from each other, and a conductive second resilient contact member and a second positioning protrusion which is not electrically connected to the second resilient contact member, the second resilient contact member and the second positioning protrusion being in contact with the second major surface at respective positions thereof that are separated from each other. The first resilient contact member and the second resilient contact member are in resilient contact with the first and second electrodes, respectively, so as to be electrically connected thereto.

The first resilient contact member opposes the second positioning protrusion with the electronic device element therebetween, and is positioned toward the periphery of the electronic device element from the second positioning protrusion. The second resilient contact member opposes the first positioning protrusion with the electronic device element therebetween, and is positioned toward an inner portion of the electronic device element from the first positioning protrusion.

The electronic device according to preferred embodiments of the present invention preferably further includes a case for receiving the electronic device element, the first resilient contact member, and the second resilient contact member. The first positioning protrusion and the second positioning protrusion may be provided in the case.

The electronic device according to preferred embodiments of the present invention may include a positive thermistor device which includes a positive thermistor element as an electronic device element.

According to preferred embodiments of the present invention, the first and second resilient contact members and the first and second positioning protrusions resiliently clamp the electronic device element. Only the first and second resilient contact members function as conductors for supplying electrical current. The first resilient contact member opposes the second positioning protrusion with the electronic device element therebetween, and is positioned toward the periphery of the electronic device element from the second positioning protrusion. The second resilient contact member opposes the first positioning protrusion with the electronic device element therebetween, and is positioned toward an inner portion of the electronic device element from the first positioning protrusion. Therefore, fragments produced by fracture of the electronic device element move in the same direction as each other with respect to the position of the fracture by being resiliently pressed by pressing forces of the first and second resilient contact members, whereby the fragments smoothly move, thereby quickly and reliably interrupting electrical current applied via to the electronic device element.

Therefore, a highly safe electronic device is provided.

When the case which is included in the electronic device according to various preferred embodiments of the present invention is made of a resin, and the electronic device element included therein is broken, electrical current is quickly interrupted, and abnormal heat generation is thereby avoided, whereby a risk of entering into an accident mode such as softening of the case can be reliably prevented.

Other elements, characteristics, features and advantages of the present invention will become more apparent from the following detailed description of preferred embodiments of the present invention with reference to the attached drawings.

DETAILED DESCRIPTION OF PREFERRED EMBODIMENTS

FIGS. 1 to 3A and 3B show a positive thermistor device 21 according to a preferred embodiment of the present invention.

Figure 1:
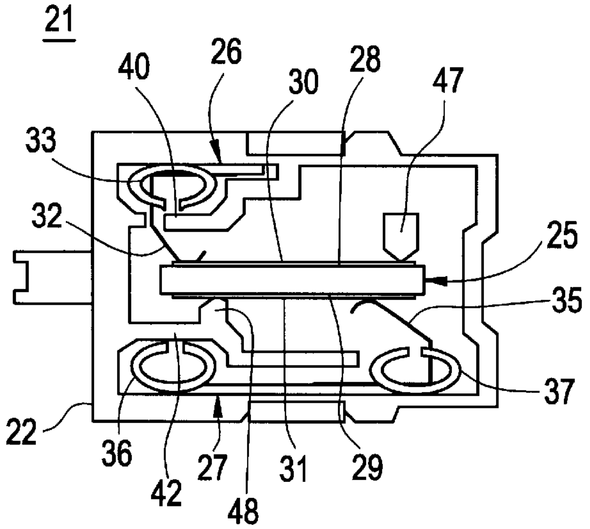
FIG. 1 is a sectional view of a critical portion of a positive thermistor device 21 according to a preferred embodiment of the present invention.
Figure 2:
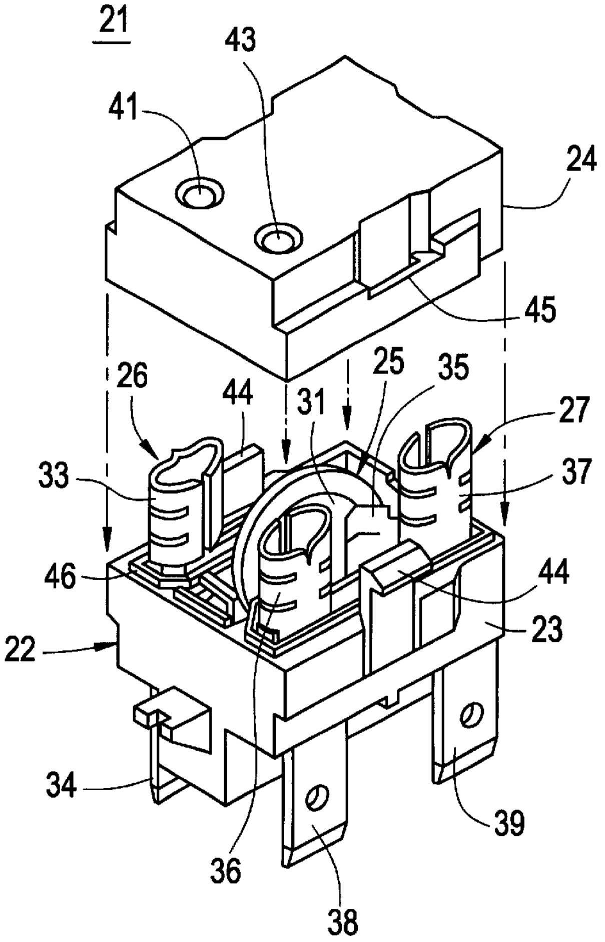
FIG. 2 is a perspective view of the positive thermistor device 21 shown in FIG. 1, with a case cover 24 being separated from other components.
Figure 3A:
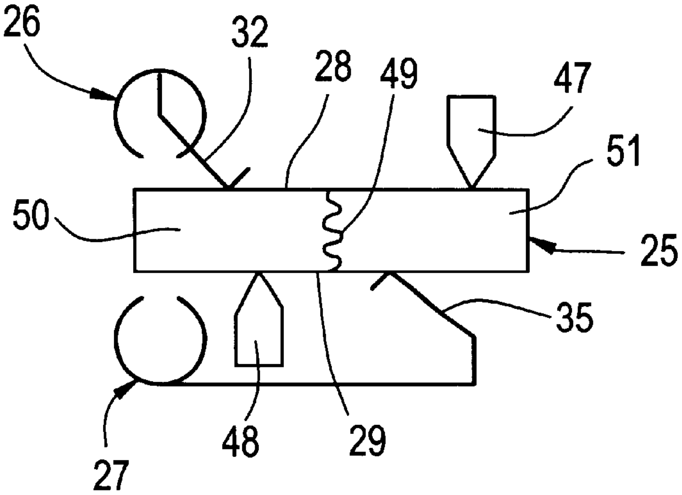
FIGS. 3A and 3B are schematic diagrams of a positive thermistor element 1 included in the positive thermistor device 21 shown in FIG. 1, which is broken and thereby interrupts electrical current.
Figure 3B:
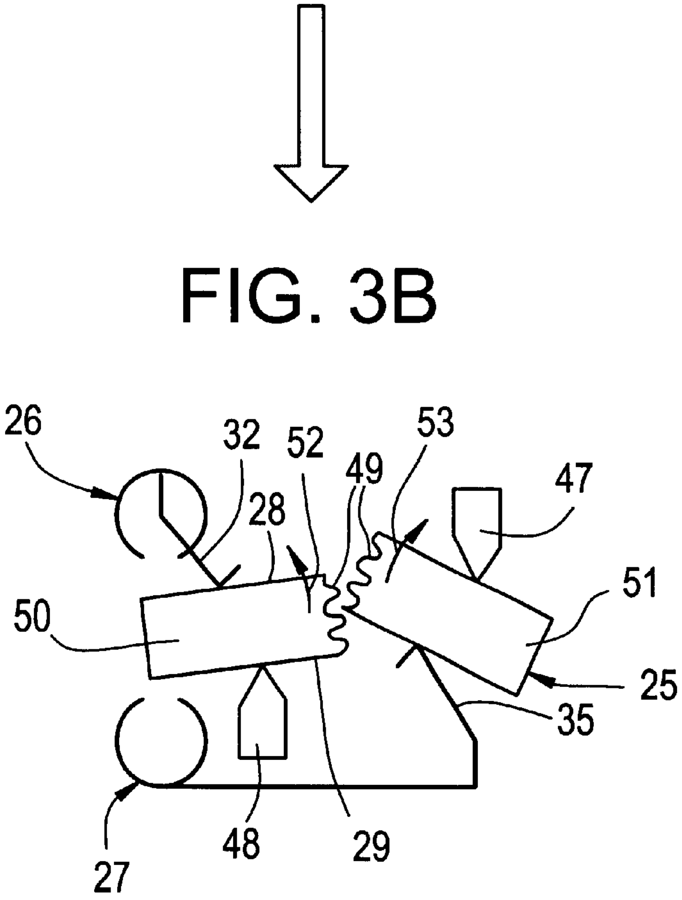
Figure 4A:
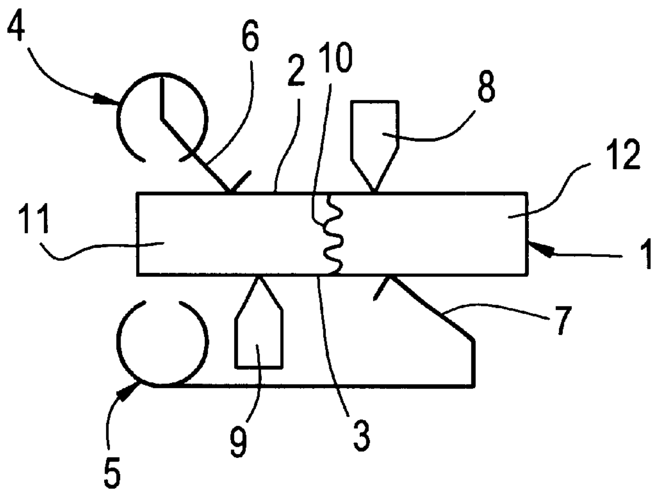
FIG. 4A PRIOR ART
FIGS. 4A and 4B are schematic diagrams of a positive thermistor element included in a known positive thermistor device, which is broken and thereby interrupts electrical current as in the positive thermistor device 21 shown in FIGS. 3A and 3B.
Figure 4A:
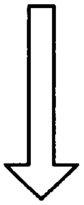
FIG. 4A PRIOR ART
Figure 4B:
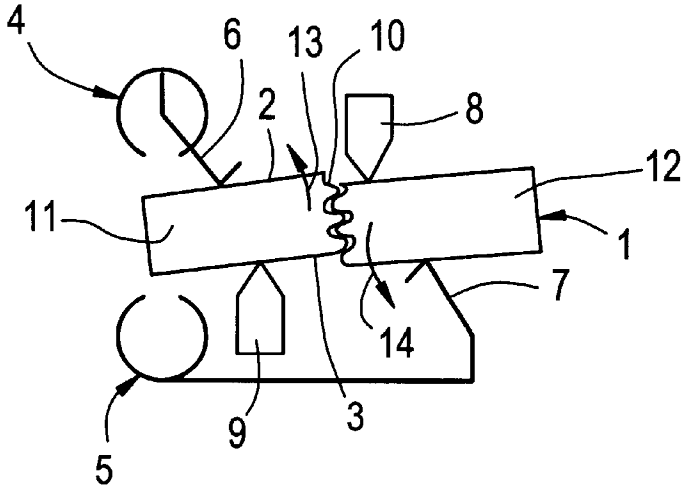
FIG. 4B PRIOR ART

FIG. 1 is a sectional view of a critical portion of the positive thermistor device 21. FIG. 2 is a perspective view of the positive thermistor device 21 of which a component is separated from the other components. FIGS. 3A and 3B are schematic diagrams of a positive thermistor element 1 included in the positive thermistor device 21 shown in FIG. 1, which is broken and thereby interrupts electrical current.

The positive thermistor device 21 is provided with a case 22. The case 22 preferably includes a case body 23 and a case cover 24.

The positive thermistor device 21 is provided with a positive thermistor element 25 and first and second terminal units 26 and 27 received in the case 22.

The case body 23 and the case cover 24 are preferably made of a high heat-resistive resin, such as phenol, polyphenylene sulfide, or polybutylene terephthalate, of which the flame retardance corresponds to 94V-0 according to the Underwriters' Laboratories (UL) Standard. A part of the bottom of the case body 23 protrudes so that the case body 23 receives a positive thermistor element 25. The case body 23 and the case cover 24 preferably have shapes so as to contain various components such as the positive thermistor element 25 and the first and second terminal units 26 and 27.

The positive thermistor element 25 having a Curie point of, for example, about 130° C. preferably has an overall disc-shaped configuration, and is provided with first and second electrodes 30 and 31 disposed on first and second major surfaces 28 and 29, respectively, of the positive thermistor element 25, which oppose each other in the thickness direction. The positive thermistor element 25 is inserted into the case body 23 at a center thereof in a manner such that the electrodes 30 and 31 face toward sides of the case body 23.

The first and second electrodes 30 and 31 are preferably individually made of, for example, nickel as lower layers and silver as upper layers. Each lower layer is preferably exposed at the periphery of the upper layer so that migration of silver of the upper layer is avoided.

The shape of the positive thermistor element 25 is not limited to a disc, and the positive thermistor element 25 may be formed to have, for example, a substantially rectangular plate-shaped configuration or may have other shapes.

The first and second terminal units 26 and 27 are inserted into the case body 23 so as to clamp the positive thermistor element 25. The first and second terminal units 26 and 27 are preferably made of metallic plates.

The first terminal unit 26 includes a first resilient contact member 32, a first socket 33 for receiving a connecter pin (not shown) and for electrical connection to the connecter pin, and a first Connecting terminal 34.

According to the present: preferred embodiment, a plate material for the first resilient contact member 32, and the plate material for the first socket 33 and the first Connecting terminal 34 which are included in the first terminal unit 26 are independently prepared, and are individually formed by welding, caulking, or other suitable process. The first terminal unit 26 and the components included therein may be arranged to be integral with each other.

The first resilient contact member 32 preferably is made of a plate, such as a stainless steel plate or a copper-titanium alloy plate, which has a superior thermal stress relaxation characteristic so that the resiliency can be maintained when the positive thermistor element 25 generates heat, and is plated with nickel as needed. The plate as a material for the first socket 33 and the first Connecting terminal 34 is preferably made of a stainless steel, a copper-titanium alloy, a copper-nickel alloy, or other suitable materials.

The second terminal unit 27 includes a second resilient contact member 35, a second socket 36, a third socket 37, a second Connecting terminal 38, and a third Connecting terminal 39. The second terminal unit 27 is preferably made of the same material as that used to form the first terminal unit 26 and by the same manufacturing method as thereof.

The first terminal unit 26 is positioned by a wall portion 40 and other portions in the case body 23 so that the first Connecting terminal 34 protrudes from the case body 23 so as to be connected to an external circuit. The case cover 24 is provided with a hole 41 through which the connecter pin is inserted into the first socket 33.

The second terminal unit 27 is positioned by a wall portion 42 and other potions provided in the case body 23 so that the second and third Connecting terminals 38 and 39 protrude from the case body 23 so as to be connected to an external circuit. The case cover 24 is provided with a hole 43 through which the connecter pin is inserted into the second socket 36.

A hole through which the connecter pin is inserted into the third socket 37 is not provided. The third socket 37 may be omitted.

The holes 41 and 43 are preferably made as small as the connecter pins can be inserted therethrough, whereby air-tightness of the case 22 is improved, and the positive thermistor device 21 can be made more resistive to environmental changes.

The case body 23 and the case cover 24 are hermetically connected to each other so that the air-tightness of the case 22 is improved. The case body 23 is provided with two hooks 44, and the case cover 24 is provided with mating parts 45 which receive the respective hooks 44 and mate therewith. The case body 23 and the case cover 24 are snap-coupled with each other, and are hermetically connected to each other.

The case body 23 is provided with ribs 46 at the periphery of an open surface of the case body 23. The case cover 24 is arranged to tightly receive the ribs 46 at the periphery of an open surface of the case cover 24, which is not shown.

The structure of the case 22 for positioning the positive thermistor element 25 is described below.

In FIG. 1, the case body 23 is provided with first and second positioning protrusions 47 and 48 rising from the bottom of the case body 23. The positive thermistor element 25 is positioned by being clamped by the first and second positioning protrusions 47 and 48 and the first and second resilient contact members 32 and 35, whereby the positive thermistor element 25 is maintained in the case 22 by being separated from the walls thereof.

The first resilient contact member 32 and the first positioning protrusion 47 are in contact with the first major surface 28 of the positive thermistor element 25 at positions that are separated from each other. The second resilient contact member 35 and the second positioning protrusion 48 are in contact with the second major surface 29 of the positive thermistor element 25 in positions thereon separated from each other. The first resilient contact member 32 and the second resilient contact member 35 are disposed, opposing each other, along a diagonal, and the first positioning protrusion 47 and the second positioning protrusion 48 are disposed, opposing each other, along the other diagonal.

In this case, the first and second resilient contact members 32 and 35 are resiliently in contact with and electrically connected to the first and second electrodes 30 and 31, respectively, of the positive thermistor element 25. The first and second positioning protrusions 47 and 48 are preferably integral with the case body 23, and are electrically insulative, whereby the first and second positioning protrusions 47 and 48 are not electrically connected to the first and second resilient contact members 32 and 35, and are not electrically connected to the electrodes 30 and 31.

The first and second positioning protrusions 47 and 48 may be made of a material that is different from that of the case body 23. The first and second positioning protrusions 47 and 48 may be made of a metal as long as the first and second positioning protrusions 47 and 48 are electrically separated from the first and second resilient contact members 32 and 35.

The first resilient contact member 32 opposes the second positioning protrusion 48 with the positive thermistor element 25 therebetween, and is positioned toward the periphery of the positive thermistor element 25 from the second positioning protrusion 48.

The second resilient contact member 35 opposes the first positioning protrusion 47 with the positive thermistor element 25 therebetween, and is positioned toward an inner side of the positive thermistor element 25 from the first positioning protrusion 47.

In the positive thermistor device 21, when the positive thermistor element 25 is broken by a spark or the like at a fracture point 49, as schematically shown in FIG. 3A, a fragment 50 moves so as to rotate in a direction along an arrow 52 about a point, at which the fragment 50 is in contact with the second positioning protrusion 48, as a fulcrum and a fragment 51 moves so as to rotate in a direction along an arrow 53 about a point, at which the fragment 51 is in contact with the first positioning protrusion 47, as a fulcrum, as shown in FIG. 3B, since resilient pressing forces of the first and second resilient contact members 32 and 35 are applied to the fragments 50 and 51, respectively, which have been produced by the fracture.

The movements of the fragments 50 and 51 in the directions along the arrows 52 and 53, respectively, are toward the same side of the positive thermistor element 25 as each other with respect to the fracture 49. That is, the movement of each fragment 50 or 51 in the direction along the arrow 52 or 53, respectively, contributes to the movement of the other fragment 51 or 50. This is because the first resilient contact member 32 is disposed toward the periphery of the positive thermistor 25 from the second positioning protrusion 48, and the second resilient contact member 35 is disposed toward an inner side of the positive thermistor element 25 from the first positioning protrusion 47.

With this arrangement, the fragments 50 and 51 can smoothly move without friction occurring between each other.

In FIG. 3B, when the fragments 50 and 51 are displaced, a conductive path between the first and second resilient contact members 32 and 35 via the positive thermistor element 25 is interrupted, whereby a circuit becomes open. A risk of entering into a more dangerous accident mode can be avoided, in that abnormal heat-generation continues after the positive thermistor element 25 has been broken.

The present invention is not limited to preferred embodiments described above with reference to the drawings, and the present invention may cover various modifications and equivalents of the embodiment included within the sprit and scope of the present invention.

For example, although according to preferred embodiments shown in the drawings, the positive thermistor device 21 includes the case 22, the case 22 may be omitted when the first and second resilient contact members 32 and 35 are supported by a structure other than the case 22, the first and second positioning protrusions 47 and 48 are provided on a structure other than the case 22, and the positive thermistor element 25 can be supported by being clamped by the first and second resilient contact members 32 and 35 and the first and second positioning protrusions 47 and 48.

Although a positive thermistor device is used in the above-described preferred embodiments, the present invention is not limited to the positive thermistor device. The present invention may be applied to other electronic devices in which electronic device elements corresponding to the positive thermistor element are supported and are supplied with electrical current in the same manner as the above positive thermistor device, and are broken due to deterioration.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electronic device comprising:

an electronic device element including first and second major surfaces opposing each other in the thickness direction, and first and second electrodes disposed on the first and second major surfaces, respectively;

a conductive first resilient contact member and a first positioning protrusion which are not electrically connected to each other, the first resilient contact member and the first positioning protrusion being in contact with the first major surface at respective positions thereof separated from each other; and a conductive second resilient contact member and a second positioning protrusion which are not electrically connected to each other, the second resilient contact member and the second positioning protrusion being in contact with the second major surface at respective positions thereof separated from each other;

wherein the first resilient contact member and the second resilient contact member are in resilient contact with the first and second electrodes, respectively, so as to be electrically connected thereto;

the first resilient contact member opposes the second positioning protrusion with the electronic device element therebetween, and is positioned toward the periphery of the electronic device element from the second positioning protrusion; and the second resilient contact member opposes the first positioning protrusion with the electronic device element therebetween, and is positioned toward an inner portion of the electronic device element from the first positioning protrusion.

2. An electronic device according to claim 1, further comprising a case that contains the electronic device element, the first resilient contact member, and the second resilient contact member, wherein the first positioning protrusion and the second positioning protrusion are provided in said case.

3. An electronic device according to claim 1, wherein the electronic device element is a positive thermistor element.

4. An electronic device according to claim 3, wherein the positive thermistor element has a substantially disc-shaped configuration.

5. An electronic device according to claim 1, wherein the case is made of a high heat-resistive resin.

6. An electronic device according to claim 1, wherein the first resilient contact member includes one of a stainless steel plate and a copper-titanium plate.

7. An electronic device according to claim 1, wherein the second resilient contact member includes one of a stainless steel plate and a copper-titanium plate.

8. An electronic device according to claim 1, wherein the case includes a case body and a case cover which are hermetically connected to each other.

9. An electronic device according to claim 8, wherein the case body includes a plurality of ribs located at the periphery of an open surface of the case body and the case cover is arranged to mate with the plurality of ribs at the periphery of an open surface of the case cover.

10. An electronic device according to claim 8, wherein the case body includes first and second positioning protrusions extending upwardly from the bottom of the case body so as to position the electronic device element in the case.

11. An electronic device according to claim 10, wherein the electronic device element is positioned by being clamped by the first and second positioning protrusions and the first and second resilient contact members 32.

12. An electronic device according to claim 11, wherein the electronic device element is spaced from walls of the case.

13. An electronic device according to claim 8, wherein the first and second positioning protrusions are integral with the case body.

14. An electronic device according to claim 8, wherein the first and second positioning protrusions are made of a material that is different from that of the case body.

15. An electronic device according to claim 1, wherein the first and second positioning protrusions are not electrically connected to the first and second resilient contact members, and are not electrically connected to the electrodes.

16. An electronic device according to claim 1, further comprising a first terminal unit and a second terminal unit which are arranged to clamp the electronic device element.

17. An electronic device according to claim 16, wherein the first terminal unit includes the first resilient contact member, a first socket for receiving a connecter pin and for electrical connection to the connecter pin, and a first Connecting terminal.

18. An electronic device according to claim 17, wherein the elements of the first terminal unit are integral with each other.

19. An electronic device according to claim 16, wherein the second terminal unit includes the second resilient contact member, a second socket for receiving a connecter pin and for electrical connection to the connecter pin, and a second Connecting terminal.

20. An electronic device according to claim 19, wherein the elements of the second terminal unit are integral with each other.

* * * * *